(12) United States Patent
Spitzer et al.

(10) Patent No.: US 7,770,147 B1
(45) Date of Patent: Aug. 3, 2010

(54) AUTOMATIC GENERATORS FOR VERILOG PROGRAMMING

(75) Inventors: Marc Spitzer, San Jose, CA (US); John Packer, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 1344 days.

(21) Appl. No.: 11/234,623

(22) Filed: Sep. 22, 2005

Related U.S. Application Data

(63) Continuation-in-part of application No. 11/075,830, filed on Mar. 8, 2005, now abandoned.

(60) Provisional application No. 60/551,531, filed on Mar. 8, 2004.

(51) Int. Cl.
*G06F 9/44* (2006.01)
*G06F 9/45* (2006.01)

(52) U.S. Cl. .................. 717/106; 717/134; 717/136

(58) Field of Classification Search ......... 717/106–110, 717/112–116, 134–139
See application file for complete search history.

(56) References Cited

U.S. PATENT DOCUMENTS

| | | | |
|---|---|---|---|
| 5,740,441 A * | 4/1998 | Yellin et al. | 717/134 |
| 6,507,947 B1 * | 1/2003 | Schreiber et al. | 717/160 |
| 6,539,520 B1 * | 3/2003 | Tiong et al. | 716/3 |
| 6,591,402 B1 * | 7/2003 | Chandra et al. | 716/5 |
| 6,606,588 B1 * | 8/2003 | Schaumont et al. | 703/15 |
| 6,817,012 B1 * | 11/2004 | Zammit et al. | 717/136 |
| 6,907,599 B1 * | 6/2005 | Kashai et al. | 717/137 |
| 6,996,799 B1 * | 2/2006 | Cismas et al. | 717/106 |
| 7,007,261 B1 * | 2/2006 | Ballagh et al. | 716/17 |
| 7,036,106 B1 * | 4/2006 | Wang et al. | 716/18 |
| 7,086,047 B1 * | 8/2006 | Edwards et al. | 717/160 |
| 7,206,732 B2 * | 4/2007 | Williams et al. | 703/22 |
| 7,210,129 B2 * | 4/2007 | May et al. | 717/136 |
| 7,260,815 B1 * | 8/2007 | Chen et al. | 717/134 |
| 7,290,244 B2 * | 10/2007 | Peck et al. | 717/109 |
| 7,316,006 B2 * | 1/2008 | Cook et al. | 717/135 |
| 7,388,978 B2 * | 6/2008 | Duvdevani et al. | 382/145 |
| 7,434,030 B2 * | 10/2008 | Irie et al. | 712/209 |
| 7,437,700 B2 * | 10/2008 | Wang et al. | 716/18 |
| 7,496,869 B1 * | 2/2009 | Janneck et al. | 716/3 |
| 7,565,631 B1 * | 7/2009 | Banerjee et al. | 716/3 |
| 7,577,395 B2 * | 8/2009 | Baek et al. | 399/405 |
| 7,653,895 B1 * | 1/2010 | James-Roxby et al. | 717/106 |

OTHER PUBLICATIONS

Key et al, "Object oriented modeling and synthesis and system C specifications", IEEE, pp. 238-243, 2004.*
Gillenwater et al, "Synthesizable high level hardware descriptions", ACM PEPM, pp. 41-50, 2008.*
Li et al, "A design driven partitioning alogorthm for distributed Verilog simulation", IEEE PADS, pp. 1-8, 2007.*
Leupers, "Code generation for embedded procesosors", IEEE, pp. 173-178, 2000.*

* cited by examiner

*Primary Examiner*—Anil Khatri
(74) *Attorney, Agent, or Firm*—Martin Penilla & Gencarella, LLP

(57) ABSTRACT

A method for generating hardware description language source files is provided. The method includes extracting an input/output (I/O) list and building a port list declaration file from the I/O list. The method also includes building a default instantiation file according to renaming rules and interpreting coding constructs to determine both variable types and sizes. The method further includes generating a sensitivity list.

10 Claims, 5 Drawing Sheets

Manual In Line

Module A

End Module

Module B

Incl File A. V. ins
Incl File B. V. ins
300

AUTOMATIC GENERATORS FOR VERILOG PROGRAMMING

CROSS REFERENCE TO RELATED APPLICATIONS

The present application is a continuation-in-part and claims priority under 35 U.S.C. §120 of application that is commonly assigned to the assignee of the present invention, which is entitled "Automatic Generators for Verilog Programming", application Ser. No. 11/075,830 filed Mar. 8, 2005 now abandoned. This application claims priority under 35 U.S.C. §119(e) from U.S. Provisional Patent Application No. 60/551,531, filed Mar. 8, 2004. The disclosures of each Application, and the Provisional Application, are incorporated by reference.

BACKGROUND

Writing ASIC source files in Verilog Hardware Description Language, (Verilog HDL), requires certain redundant overhead. The redundant overhead occurs when the RTL file is being built during which the same signals have to be listed at different places within the list. For example, a port list might list signals a, b, and c as they are coming in and then in the input/output list, the same signals a, b, and c might be listed as pins coming out. Some of the redundant information includes declaring the type and sizes of signals used in the design, sensitivity lists for constructs such as state machines and case statements, port lists which are the same as the input/output declarations, and module file instantiations. Moreover, such redundant information was previously entered manually, and such maintenance consumes large portions of an individual's time.

As a result, there is a need to eliminate the creation of such redundant information manually in order to reduce the overhead involved with respect to an individual's time.

SUMMARY

Broadly speaking, the present invention fills these needs by providing a method and apparatus for removing redundant overhead for programming in the Verilog HDL language. It should be appreciated that the present invention can be implemented in numerous ways, including as a process, an apparatus, a system, or a device. Several inventive embodiments of the present invention are described below.

In one embodiment, a method for generating hardware description language source files is provided. The method includes extracting an input/output (I/O) list and building a port list declaration file from the I/O list. The method provides building a default instantiation file according to renaming rules and interpreting coding constructs to determine both variable types and sizes. The method further includes generating a sensitivity list.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method that automatically generates a sensitivity list for Verilog programming. The redundancy associated with programming in the Verilog HDL language is eliminated by having a method that will automatically parse the source file to extract the needed information and from the extracted information, and corrects the extracted information, if necessary, in order to make the appropriate type and size declarations of signals being used. The method further generates the sensitivity lists for programming constructs, such as state machines and case statements, and lists out the port signals. The method also generates a module file instantiation and stores it in a separate file. A configuration file may be utilized to direct the program on multiple file parsing, as well as when, and how many instantiation files need to be generated per file parsed. The embodiments described below are described with reference to Verilog coding syntax. However, one skilled in the art will appreciate that these embodiments may be expanded to apply to any hardware description language (HDL).

When coding in a HDL language, e.g., Verilog, there is certain redundant overhead which is eliminated by the embodiments described herein. It will be obvious, however, to one skilled in the art, that the present invention may be practiced without some or all of these specific details. In other instances, well known process operations have not been described in detail in order not to unnecessarily obscure the present invention.

Figure 1:
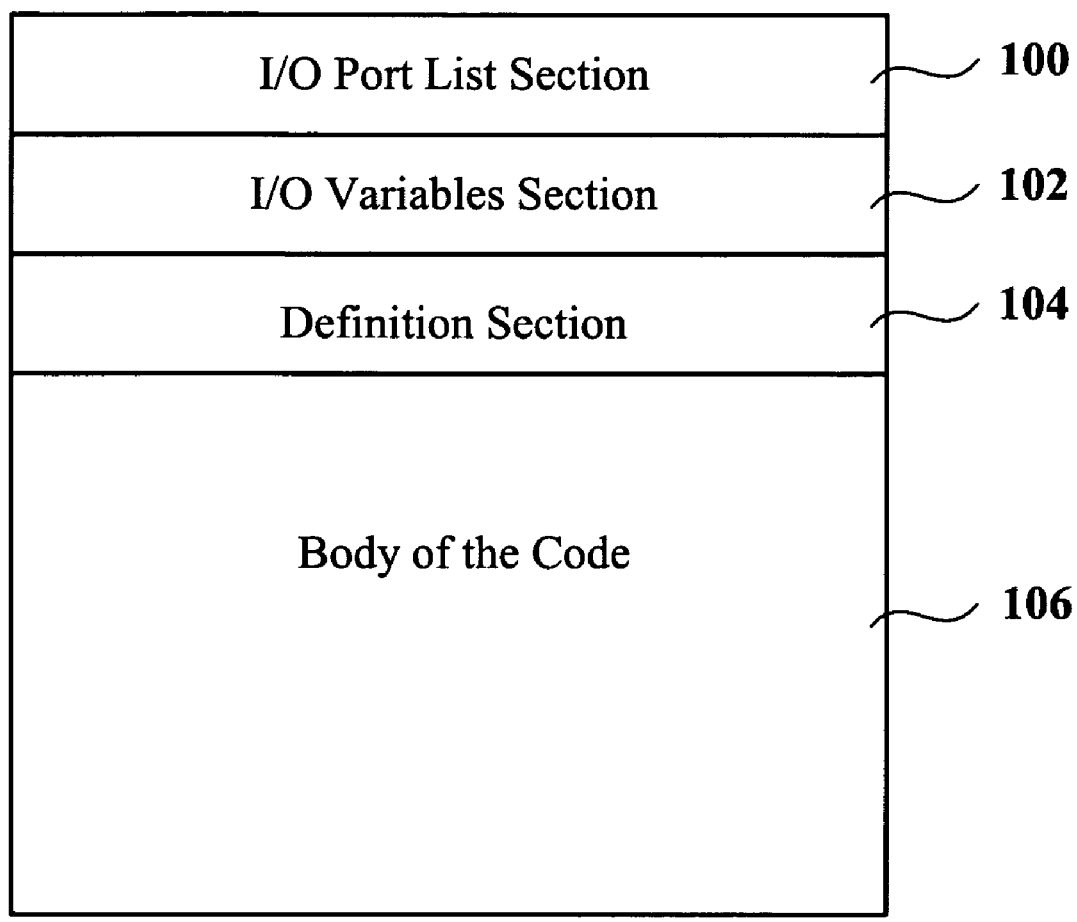
FIG. 1 is a simplified schematic diagram illustrating the files generated through a hardware programming language.

FIG. 1 is a simplified schematic diagram illustrating the files generated through a hardware programming language. FIG. 1 includes input/output (I/O) port list section 100, I/O variables section 102, definition section 104, and the body of the code 106. The I/O port list section 100 lists all the I/O signals. The I/O port list section 100 is an exact copy of the input/output list included in I/O variable section 102, except that I/O port list section 100 does not include input/output information. The I/O port list section 100 is a list of all the signals that are in the input/output list. Also, the I/O port list section 100 may be used as a reference. The I/O port list section 100 is generally used to instantiate module files. The I/O variables section 102 also provides a list of the I/O signals. In addition, the I/O variables section 102 also provides the direction indicating whether a signal is actually an input or an output and the size of the variable. For example, in case of a bus, the bus size will be provided in I/O variables section 102.

FIG. 1 is further shown to include a definition section 104. In addition to having the I/O signal list, any variables that will be used in the future are declared in the definition section 104. For instance, definition section 104 can be used to define whether a wire is combinatorial or a register implies a flip-flop and the like. In one embodiment, combinatorial refers to the logic between registers, which determines the value what successive registers receive. It should be appreciated that, when writing code, the coders need to know the type of variables. For example, if variable X=wire, and variable Y=register, as illustrated in FIG. 1, then the instruction that uses variable X can only be associated with a wire-type instruction. Similarly, the instruction that uses variable Y can only be associated with a register-type instruction. As can be seen, even if there are no differences between a wire and a register, the register and wire must still be defined.

If the registers and the wires are not defined, the compiler flags an error message and indicates which one of the registers or the wires is not defined. For example, a register size may not be defined properly because the register may be a bus of more than one bit, or a single bit. In this case, the compiler is likely to signal an error indicating that the register is not defined. This becomes an iterative process because the compiler detects only one error during each compilation process. Therefore, the compiler has to be compiled several times to locate all the variables that are not defined. This is one type of redundancy that the present invention is capable of eliminating. The system and method described herein is capable of distinguishing between different circuit elements such as a wire and a register or the difference between the two. A considerable amount of time can be saved by not having to define each and every variable. In one embodiment, defining the variable includes declaring the variables.

Figure 2:
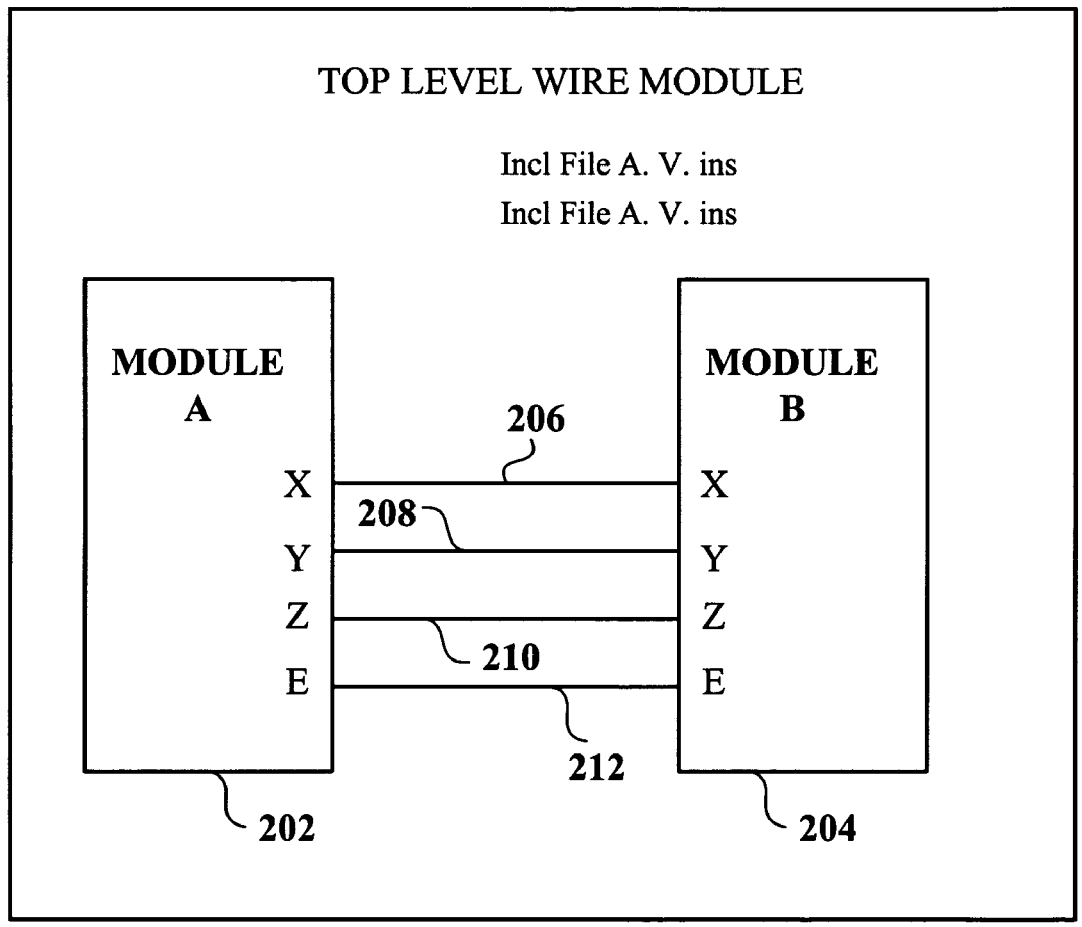
FIG. 2 is a simplified schematic diagram illustrating a top level wire module file in accordance with one embodiment of the invention.

FIG. 2 is a simplified schematic diagram illustrating a top level wire module file in accordance with an embodiment of the present invention. FIG. 2 includes module file A and module file B. Both module file A and module file B include pins X, Y, Z, and E. FIG. 2 is further shown to include wires 206, 208, 210, and 212 connecting the pins X, Y, Z, and E, respectively of module file A and module file B. As described above, previously, the pins X, Y, Z, and E as well as the wires 206, 208, 210, and 212 have to be typed, instantiated and declared. In contrast, the method described herein will automatically generate the top level wire module file when the input and the output variables are provided. All that is required by the designer is to state that "include module A" and "include module B". In one embodiment, the variables are defined in module file A and module file B by generating files A.v.ins and B.v.ins, respectively. For example, generating file B.v.ins is analogous to generating a file called X(X) which includes a wire up signal X at the top level, which calls signal X to module file B's pin X. Similarly, file A.v.ins also has an X and .X format. This essentially takes A's pin X and wires the pin X up to signal X. In this way, the same signal, i.e., X, is kept and no name change is required. One skilled in the art will understand that the names may be modified and it is not necessary that the same name be retained.

Still referring to FIG. 2, at the top level, as mentioned above, all that are needed are the instructions "include file A.v.ins" and "include file B.v.ins." From the files A.v.ins and B.v.ins, the method described herein automatically generates the port list and the definitions (shown in FIG. 1). The "include" command, basically, allows the information stored in the files to be used. The include command also helps to move the information externally to a file that is automatically generated.

Figure 3:
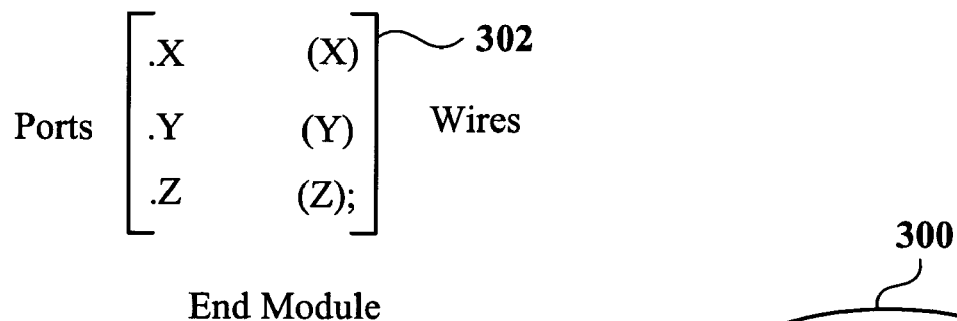
FIG. 3 illustrates the manual inline representation of the code in accordance with one embodiment of the invention.
Figure 3:
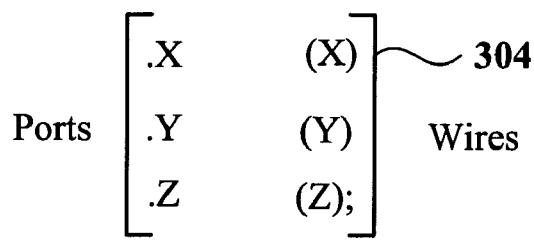

FIG. 3 illustrates the manual inline representation of the code in accordance with an embodiment of the present invention. In FIG. 3, a comparison is made between manually instantiating module file A and module file B with automatically instantiating module file A and module file B. As can be seen, in manual inline mode, a declaration made for each of the ports X, Y, Z, and E. For example, in module file A, port X i.e., .x, in module file A is attached to wire X, (x), port Y, i.e., .y, is attached to wire (y), and port Z, i.e., .z, is attached to wire (z). Similarly, in module file B, port X, i.e. .x is attached to wire X, (x) port Y i.e. .y is attached to wire (y), and prot Z i.e. .z is attached to wire (z). Instead of manually associating the ports with the wires, the method described herein automatically associates port with wires, by incorporating the instructions "include FileA.v.ins" and "include FileB.v.ins", into the method described herein, as shown in bubble 300 of FIG. 3.

Figure 4:
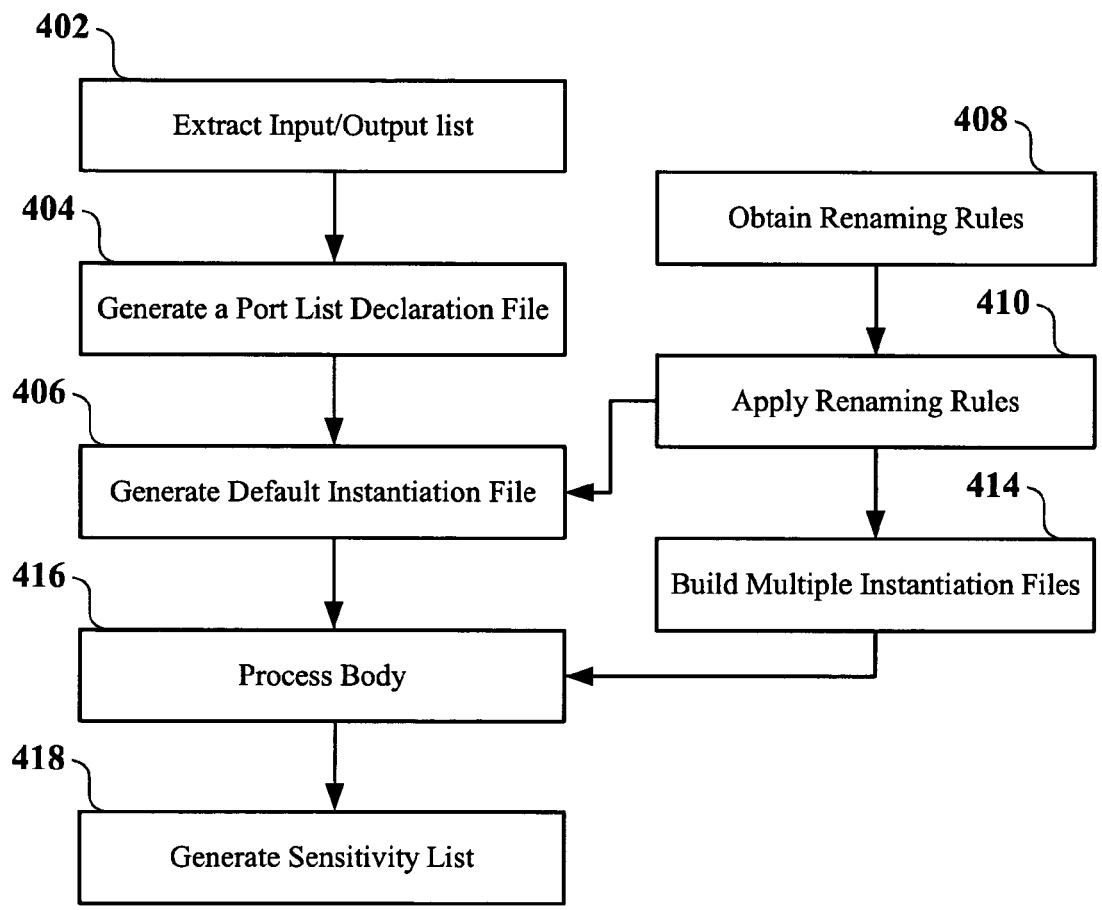
FIG. 4 is a flowchart diagram of the method operation for automatically generating a sensitivity list in accordance with one embodiment of the invention.

FIG. 4 is a flowchart of the method operations for automatically generating a sensitivity list in accordance with one embodiment of the invention. The method begins in operation 402 where an input/output list is extracted. The input/output list is extracted by first reading the input/output variables and, from the input/output variables, an input/output list is generated. In one embodiment, the extracted input/output list is stored in a file different from the file where the input/output variables are stored. Next in operation 404, a port list declaration file is automatically generated from the input/output list. As described above, the declaration file is where all the variables are defined. By defining variables, different circuit elements may be distinguished. For example, a wire may be distinguished from a register. The method described herein can automatically distinguish between the different variables in the extracted input/output list.

Thereafter, in operation 406, a default instantiation file is generated. The default instantiation file includes a list of port names, and the wire names to which the ports get connected. When a module file of the type described above is instantiated, the signal names going in and out of the module file should be the same. The signal name should be associated with a port name and the port name should be associated with a wire name. The method described herein automatically builds the default instantiation file where by labeling the port names and the wire names, which are obtained from the port list declaration file. The renaming rules are obtained and applied to the instantiation file as indicated in operations 408 and 410. The renaming procedure will be discussed in detail below.

It should be appreciated that a module file may be instantiated multiple times provided a different instantiation name is used each time. However, during each instantiation, the signal names are kept the same. In cases where the module file gets instantiated multiple times, the module file builds multiple instantiation files and the renaming rules are applied per instantiation as shown in operation 410 and 414. The renaming rules are defined and is obtainable as needed as indicated in operation 408. In one embodiment, the renaming rules are defined in a configuration file. It should be appreciated that the rules are well-defined rules and, in one embodiment, a regular expression syntax is used. One of the advantages of this method is that the regular expression syntax is used to search only the connected wires and not the ports, since the ports will remain the same.

Once the instantiation files are built, the operation moves onto processing the body in operation 416. During the processing, the information provided in the instantiation files are interpreted and followed accordingly. For example, from the information provided in the instantiation files, a determination can be made as to the type of variable, i.e. a register or a wire and the corresponding size, etc. With respect to the size, a size suitable for the application or a programming construct may be used to declare the size. It should be understood that when a variable is being declared, the method described herein will maintain parameters. Parameters are Verilog HDL construct. Parameters can be used to declare wire sizes, and register sizes, etc. In case of buses, parameters may be used to establish relationship between buses. Parameters can also be placed in a separate file and be included into multiple module files by using the "include" statement. Thereby, multiple designers may write around a common set of parameters, so that the separate module files by the designers may interact with each other. In one embodiment, the parameters are declared in a common file that is accessible by all of the designers. Thus, when a parameter has to be changed, the parameter only has to be changed in the common file and not in the individual module files which uses the parameter.

In one embodiment, the method described herein includes scripts or codes, which automatically generates Verilog HDL based source code files to contain the redundancy removed from the originally parsed Verilog HDL based source code. One such generated source coded file contains the port list. The second such generated source code file contains all the declarations for wires versus registers and the size of such wires. Without a notice, what was previously defined as a register may become a wire, and vice versa and the script takes this into account and makes the changes accordingly. Therefore, the embodiments described herein have a macro script that combs through the body of the module files and parses the module files multiple times and determines whether there are any changes. In one embodiment, the body of the module files describes the combinatorial logic and which values get loaded into registers. Thus, the macro script eliminates the need to write declarations. The script scans the body of the module files, and follows the instructions, to determine what variables are needed, and the weight of their registers, or wires, thereby automating what used to be the manual inputting of items.

Subsequent to body processing, a sensitivity list is generated in operation 418. Sensitivity lists are specific coding constructs. In one embodiment, the sensitivity list is called by an "always @" statement. Sensitivity lists are used when there are multiple signals involved and a common path needs to be declared. In one embodiment, the sensitivity list provides a list of signals that are going to be used in a certain body of the code. Therefore, at the time of code execution, the codes to be executed are determined by the signals listed in the sensitivity list. When a particular signal in the sensitivity list changes, a corresponding section of the code is executed. Therefore, if a signal is not listed in the sensitivity list, the code corresponding to the signal will not be executed. The embodiments described herein will automatically generate the sensitivity list. Therefore, the signals to be listed in the sensitivity list will not be missed. Even in cases where the signals are changing, the sensitivity list will automatically rebuild to accommodate the changes. The script is capable of detecting which signals are active and which signals are used in the body that are different from the sensitivity list.

Figure 5:
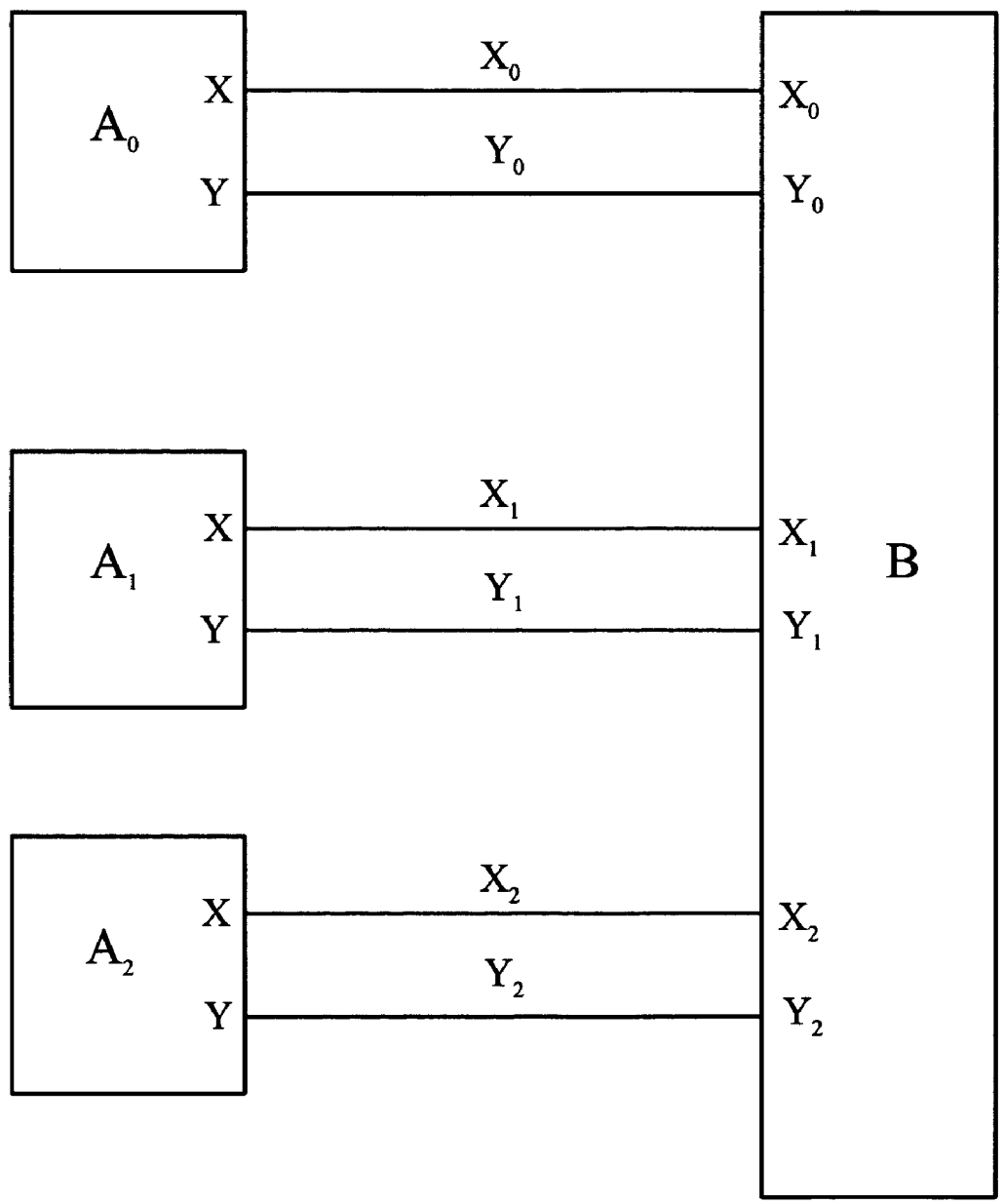
FIG. 5 illustrates an exemplary representation of the logic displayed to a design engineer in accordance with one embodiment of the invention.

FIG. 5 illustrates the renaming process when there are multiple instantiations of the file in accordance with an embodiment of the present invention. FIG. 5 shows three instantiations $A_0$, $A_1$, and $A_2$ of file A. Each time file A is instantiated a new instantiation name was provided to file A. The instantiated files generated with the new names are File $A_0$.v.ins, File $A_1$.v.ins, and File $A_2$.v.ins. As can be seen, ports X in files $A_0$, $A_1$, and $A_2$ are appended to wires $X_0$, $X_1$, and $X_2$, respectively. Similarly, ports Y in files $A_0$, $A_1$, and $A_2$ are appended to wires $Y_0$, $Y_1$, and $Y_2$, respectively. In file B, the ports are not renamed since the associated port names for wires $X_0$, $X_1$, and $X_2$ and $Y_0$, $Y_1$, and $Y_2$ are $X_0$, $X_1$, and $X_2$ and $Y_0$, $Y_1$, and $Y_2$, respectively. One skilled in the art should understand that the names for the ports and the wires are arbitrary and it is not necessary that the names for the ports and the wires match. For instance, it is possible to place a wire $L_M$ with port $L_0$, or wire $M_N$ with port $M_0$ or $M_1$. However, it will be more straightforward to use the same file name and calling that name many times, since the instantiation files are created automatically and the wiring is done automatically.

The script will automatically generate the instantiation files if a different name is used. As described above, when a module file is instantiated multiple times, different instance names are given for each instantiation. The use of multiple instantiations requires the use of the configuration file to list the desired instance names. By default, the program will generate a separate instantiation file each instance name provided. Also by default, no name changes of the wire names utilized in the instantiation files, will be changed. If wire name changes are desired, a separate section of the configuration file is provided to list these name changes. The name changes are listed for each instance separately. In other words, each group of desires name changes designates itself by using the instance name they are to be applied to. In one embodiment, there will be no sharing of name changes. For instance, if two instances need the same set of name changes applied, these name changes will be listed twice.

As can be seen, the method described herein forces the user to declare the variables at the beginning, which helps to prevent errors due to undeclared variables. For example, if a wire or a register is only going between two included files, then that variable is declared as a Verilog syntax. However, when a wire is being utilized, the wire need not be declared since Verilog HDL, allows for "implied wire declarations". When some of the undeclared wires are eventually turned into buses, and if the interconnect wire remains undeclared, this can lead to errors. Therefore, by generating all the instantiation files first, names become known, even though the variables might have been renamed using the renaming rules.

Moreover, the port names are not decided a priori, instead, port names reflect the names used in the input/output port list section of the module file being connected. As such, based on which wire the port is connected to and depending on this information, an appropriate wire size and an appropriate name are declared. As described above, port and wire names need not match. The wire names generally determined by the parent module file which is using the instantiation file that is being generated. In one embodiment, the wire names match the port names. In another embodiment, where there are multiple versions of a module file, some or all of the wire names are changed to depend on the instantiation file being generated to make some or all wires coming out of each of the instantiation unique.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for generating hardware description language source files, comprising:
   extracting an input/output (I/O) list;
   building a port list declaration file from the I/O list, the building including,
      distinguishing between the variable types in the extracted input/output list; and
      defining variables according to the variable types;
   building a default instantiation file according to renaming rules where signal names and port names are kept constant for multiple instantiations;
   interpreting coding construct to determine both I/O variable types and sizes; and
   generating a sensitivity list, wherein each operation is executed by a microprocessor.

2. The method of claim 1, wherein the variable types includes register types and wire types.

3. The method of claim 1, wherein extracting an input/output list includes,
   reading input/output variables; and
   generating the port list written into a Verilog source code file.

4. The method of claim 3, wherein the input/output list includes,
   a direction and a size of the input/output variables.

5. The method of claim 1 wherein building a default instantiation file includes,
   labeling port names and wire names which are obtained from the port list declaration file.

6. The method of claim 1, wherein the sensitivity list includes a list of signals, any change to which causes execution of a section of code.

7. The method of claim 1, wherein the port list includes,
   list of signals in the input/output list.

8. The method of claim 1, wherein the process of building a
   default
instantiation file further comprising:
   obtaining renaming rules from a configuration file where the rules are defined through regular expression syntax; and
   applying renaming rules.

9. A computer readable storage medium for generating hardware description language source files, comprising:
   program instruction for extracting an input/output (I/O) list;
   program instruction for building a port list declaration file from the I/O list, the program instructions for building including,
      program instruction for distinguishing between the variable types in the extracted input/output list; and
      program instruction for defining variables according to the variable types;
   program instruction for building a default instantiation file according to renaming rules where signal names and port names are kept constant for multiple instantiations;
   program instruction for interpreting coding construct to determine both I/O variable types and sizes; and
   program instruction for generating a sensitivity list.

10. The computer readable storage medium as recited in claim 9, wherein the input/output list includes, a direction and a size of the input/output variables.

* * * * *